United States Patent [19]

Keilmann

[11] Patent Number: 4,996,505

[45] Date of Patent: Feb. 26, 1991

[54] FREQUENCY TRIPLICATOR FOR MICROWAVES

[75] Inventor: Fritz Keilmann, Stuttgart, Fed. Rep. of Germany

[73] Assignee: Max-Planck-Gesellschaft zur Foerderung der Wissenschaften e.V., Fed. Rep. of Germany

[21] Appl. No.: 330,332

[22] Filed: Mar. 29, 1989

[30] Foreign Application Priority Data

Mar. 31, 1988 [DE] Fed. Rep. of Germany ....... 3811116

[51] Int. Cl.$^5$ .................... H02M 5/20; H03B 19/14
[52] U.S. Cl. ..................................... 333/218; 363/159
[58] Field of Search ................ 333/218, 250; 363/157, 363/159

[56] References Cited

U.S. PATENT DOCUMENTS

| | | | |
|---|---|---|---|
| 3,290,619 | 12/1966 | Geusic et al. | 333/218 X |
| 3,379,956 | 4/1968 | Battles et al. | 333/218 |
| 3,742,335 | 6/1973 | Konishi | 363/159 |
| 3,944,950 | 3/1976 | Jacobs et al. | 333/250 X |
| 3,963,977 | 6/1976 | Mitsui | 363/159 |
| 4,527,137 | 7/1985 | Hartley | 333/218 X |

OTHER PUBLICATIONS

Takada T, and Ohmori M; "Frequency Tripler and Quadruplers with GaAs Schottly Barrier Diodes at 450 and 600 GHz"; *IEEE Trans an Microwave Theory & Tech;* MTT27, No. 5, May 1979, pp. 519-523.

*Primary Examiner*—Benny Lee
*Attorney, Agent, or Firm*—Henry C. Nields

[57] ABSTRACT

Frequency triplicator for microwaves having frequencies above about 30 GHz, for example 70 GHz, comprising a non-linear element of a weakly doped semiconductor material, in particular n—Si with a carrier concentration of $10^{13}$ cm$^{-3}$ and less.

8 Claims, 1 Drawing Sheet

FREQUENCY TRIPLICATOR FOR MICROWAVES

BACKGROUND OF THE INVENTION

1. Field of the Invention

The present invention relates to a frequency triplicator for microwaves, in particular for microwaves with input frequencies above about 30 GHz to for example about 100 or 200 GHz.

Microwave radiation of high power is required for example for heating fusion plasmas. With the present microwave generators, for example gyrotrons, about 200 kW can be generated at about 70 GHz. However, microwave radiation of still higher frequency is required, for example up to 300 GHz and more, to be able to effectively heat plasmas with a higher electron density than hitherto. The development of transmission tubes for such high frequencies becomes increasingly difficult the higher the frequency because for example in gyrotrons increasingly higher magnetic fields are required and in addition the mechanical tolerances become increasingly more critical with decreasing wavelength.

2. Description of the Related Art including information disclosed under 37 CFR §§1.97-1.99

From a publication by K. Seeger, J. Appl. Phys. 34, No. 6, June 1963, p. 1608-1611, it is known to triple the frequency of electromagnetic oscillations having a frequency of about 10 GHz by means of a nonlinear material, i.e. n-germanium with a resistivity of 5.5 ohm·cm. The maximum efficiency, i.e. the ratio of output power in the triple frequency to input power in the fundamental frequency, was only about 0.95% and at the end of said publication it is stated that the power of the third harmonic generated decreases with increasing frequency. From a publication of A. Mayer and F. Keilmann, Physical Review B, 33, No. 10, May 15, 1986, p. 6962-6968, it is known that in the far infrared region frequency triplication can be achieved with the aid of doped semiconductor materials such as Ge, Si and GaAs, and an efficiency of $10^{-3}$ was measured.

SUMMARY OF THE INVENTION

It has now surprisingly been found that microwaves having frequencies above about 30 GHz, for example 50 GHz and more, with high powers of the fundamental wave, can be tripled with high efficiency by passage through or interaction with weakly doped semiconductor materials, preferably n-Si, having a doping concentration of the order of magnitude of $10^{13}$ cm$^{-3}$ and less, for example with an efficiency of more than 50% for a frequency triplication of microwave radiation having a frequency of 70 GHz and a power of 200 kW.

Preferred embodiments of the invention have individual, several, or all of the following features: the carrier concentrations in the semiconductor material is less than $10^{13}$ cm$^{-3}$ down to $10^{12}$ cm$^{-3}$ and less; the semiconductor material is n-conductive silicon; the semiconductor material forms an orientated single crystal body; the input power is greater than 10 kW, in particular greater than 100 kW.

It has been found that in a frequency triplication of electromagnetic oscillations in the microwave range above about 30 GHz with weakly doped semiconductors a completely different mechanism is active as with lower frequencies of for example 10 GHz and higher dopings, as were investigated by Seeger (loc. cit.) for with a fundamental frequency of the order of magnitude of 10 GHz a periodic heating up and cooling down of the entire electron gas takes place in the nonlinear material in the rhythm of the fundamental frequency. This heating/cooling cycle becomes increasingly ineffective with increasing fundamental frequency because the temperature is increasingly unable to follow the electrons of the fundamental oscillation so that the modulation of the temperature and thus the efficiency of the frequency triplication approach zero with increasing frequency. In the invention, in contrast, a completely different mechanism is utilized. It has been found that at frequencies of above about 30 GHz, for example 70 GHz and more, and carrier concentrations of the order of magnitude of $10^{13}$ cm$^{-3}$ and less, the electrons oscillate quasi isolated from each other and due to the interaction of the electrons with the crystal lattice and a slight dependence of the impact frequency on the electron speed this oscillation is not completely harmonic. That these effects in the microwave range, i.e. for example at frequencies of about 50 and 70 GHz to 100 or 150 GHz and above, lead to a surprisingly high frequency triplication efficiency cannot be concluded from the publication of Mayer and Keilmann (loc. cit.) either.

BRIEF DESCRIPTION OF THE DRAWINGS

Hereinafter preferred examples of embodiment of the invention will be explained in detail with reference to the drawings and further features, advantages and further developments of the invention will be discussed. In the drawings.

DESCRIPTION OF THE PREFERRED EMBODIMENTS

Figure 1:
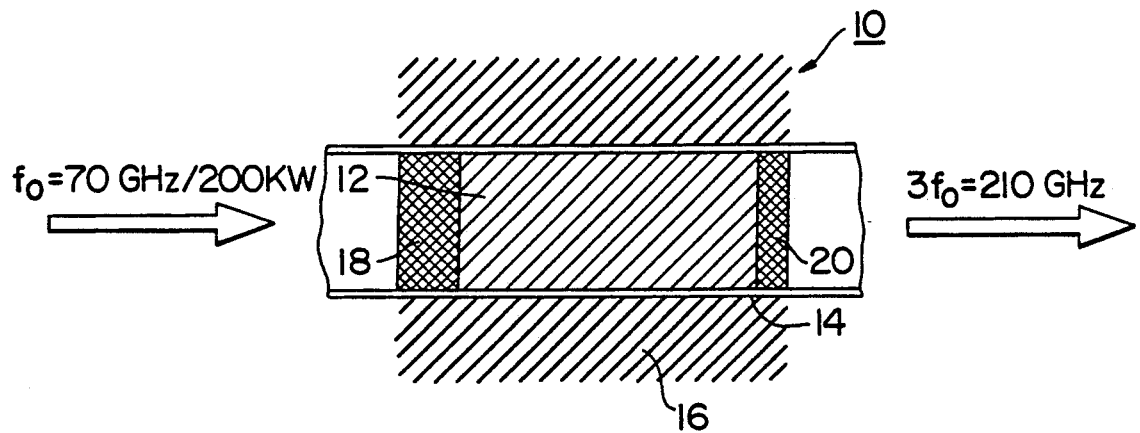
FIG. 1 is a highly simplified representation of a frequency triplicator according to a first embodiment of the invention and FIG. 2 is a corresponding illustration of a second embodiment of the invention.

In FIG. 1 as first example of embodiment of the invention a frequency triplicator 10 is shown which as nonlinear element includes a crystal 12 of weakly doped n-Si with a carrier concentration of $10^{13}$ cm$^{-3}$ or less. The length of the semiconductor crystal 12 in the propagation direction of the microwaves can be between 1 and 50 cm. The semiconductor crystal 12 is disposed in a waveguide portion 14 which forms part of a microwave line not shown in detail and it is surrounded on the outside by a cooling means 16, for example a liquid cooling jacket, which is only schematically indicated. The microwave radiation (fundamental wave) to be tripled is sent into the input-side (on the left in FIG. 1) end face of the crystal 12 and in the example of embodiment illustrated has a frequency of 70 GHz and a power of 200 kW. To prevent reflections an adapter or matching element 18 is provided at the input-side end face of the crystal 12.

The tripled microwave radiation (third harmonic), which in this case thus has a frequency of 210 GHz, is coupled out of the other output-side end face (on the right in FIG. 1). Here as well an adapter element 20 may be provided to ensure the completest possible coupling out of the tripled radiation.

The adapter elements 18, 20 may either be quarterwavelength layers with matching refractive index, for example of quartz, or formed by an appropriate configuration of the coupling-in and coupling-out face, for example by a surface corrugation. A further possibility resides in arranging the inlet face and the outlet face each at the Brewster angle to the inlet and outlet direction of the respective microwave radiation so that a reflection-free entrance and emergence is ensured.

Because of its easier availability, silicon is to be preferred to other semiconductor materials such as germanium or gallium arsenide. The n-conductive silicon also has the special advantage that the nonlinearity does not decrease at very high intensities as has been observed for n-Ge and n-GaAs.

To obtain optimum nonlinearity an orientated single crystal is to be employed, i.e. the direction of the electrical vector of the microwave oscillation should coincide substantially with the |100|-direction of the silicon monocrystal. It has already been mentioned that a low electron density is advantageous. This also gives distribution of the dissipated heat over an adequately large volume.

The cooling means 16 may consist of copper plates which are thermally coupled to the semiconductor crystal 12 or to the waveguide portion 14 containing said crystal, or it may form the waveguide portion. The crystal 12 may also be employed free, i.e. without surrounding waveguide portion or cavity resonator. In this case the holding is by dielectric components and the cooling expediently by a nonabsorbent liquid such as alcohol. The coupling in and out of the microwave radiation can be carried out in this case by horn radiators or the like.

The cooling of the crystal to for example 70 K and below reduces the microwave absorption and at the same time increases the thermal conductivity. If a phase mismatch manifests itself in a troublesome manner, phase matching can be achieved by forming the semiconductor crystal itself as waveguide portion 22 as shown in simplified manner in FIG. 2 and by choosing the boundary conditions so that the waveguide dispersion compensates the material dispersion. Formation of the semiconductor body as hollow waveguide also makes it possible to control the mode composition in such a manner that a substantially flat intensity profile results.

Figure 2:
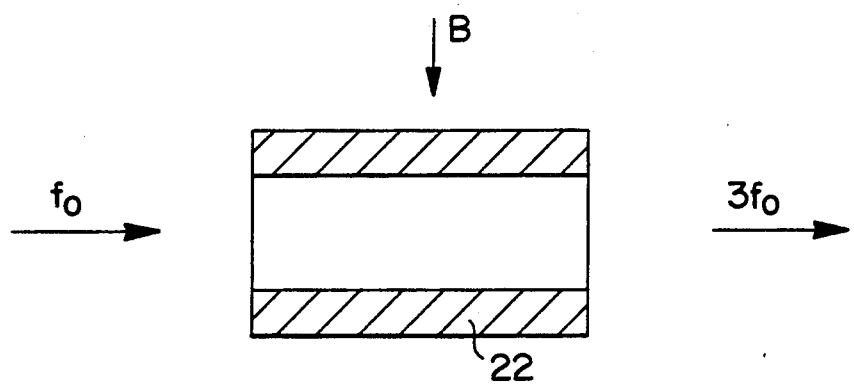

By means of an external magnetic field B as indicated schematically in FIG. 2 a resonant increase of the nonlinearity and a phase matching can be achieved. The magnetic field forces the free electrones between the surges on circular orbits and in the microwave range the cyclotron resonance is a few tenths of a Tesla (a few kilogauss). The then also resulting dispersal effects can be utilized like the dispersion originating from the waveguide for phase matching in that the intrinsic dispersion of the nonlinear medium is compensated, i.e. the difference of the refractive indices for the fundamental wave and the harmonic are made zero so that these waves then travel with the same speed because the energy conversion is then optimal.

A plurality of frequency triplicators of the type described may be connected in series. Thus, for example by connecting in series two frequency triplicators the ninth harmonic of the fundamental wave may be effectively generated.

I claim:

1. A frequency triplicator for microwaves comprising a body of a nonlinear material having an input end, adapted to receive microwave energy of a base frequency, and an output end, said microwave energy interacting with the material of said body so that electromagnetic energy containing microwave energy of three-times said base frequency emerges from said output end, wherein said base frequency is more than 30 GHz and the nonlinear material is a semiconductor material having a carrier concentration less than $10^{13}$ $cm^{-3}$.

2. A frequency triplicator according to claim 1, wherein said nonlinear material is a single crystal of said semiconductor material.

3. A frequency triplicator according to claim 1 comprising a means for generating a magnetic field in the nonlinear material.

4. A frequency triplicator according to claim 1, wherein the magnetic field lies in the order of magnitude of a few tenths of a Tesla.

5. A frequency triplicator according to claim 1, wherein the body of nonlinear material is hollow so as to form a hollow waveguide portion.

6. A frequency triplicator for microwaves comprising a body of a nonlinear material having an input end, adapted to receive microwave energy of a base frequency, and an output end, said microwave energy interacting with the material of said body so that electromagnetic energy containing microwave energy of three-times said base frequency emerges from said output end, wherein said base frequency is more than 30 GHz and the nonlinear material is a weakly doped semiconductor material, wherein the nonlinear material is n-conductive silicon having a carrier concentration of at the most about $10^{13}$ $cm^{-3}$.

7. A frequency triplicator according to claim 6, wherein the carrier concentration is of the order of magnitude of $10^{12}$ $cm^{-3}$.

8. A frequency triplicator for microwaves comprising a body of a nonlinear material having an input end, adapted to receive microwave energy of a base frequency, and an output end, said microwave energy interacting with the material of said body so that electromagnetic energy containing microwave energy of three-times said base frequency emerges from said output end, wherein said base frequency is more than 30 GHz and the nonlinear material is a semiconductor material having a carrier concentration less than $10^{13}$ $cm^{-3}$, wherein a cooling means is supported so as to surround the outside of the body of the nonlinear material.

* * * * *